(12) United States Patent
Kosugi

(10) Patent No.: US 6,197,116 B1
(45) Date of Patent: *Mar. 6, 2001

(54) PLASMA PROCESSING SYSTEM

(75) Inventor: Makoto Kosugi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/921,251

(22) Filed: Aug. 29, 1997

(30) Foreign Application Priority Data

Aug. 29, 1996 (JP) .................................... 8-228126

(51) Int. Cl.[7] ............................. C23C 16/00; C23F 1/02
(52) U.S. Cl. ........................... 118/712; 118/713; 156/345
(58) Field of Search ................................... 118/712, 713, 118/714; 156/345

(56) References Cited

U.S. PATENT DOCUMENTS

| | | | |
|---|---|---|---|
| 5,198,072 | * 3/1993 | Gabriel | 156/627 |
| 5,444,259 | * 8/1995 | Ohmi | 250/452.21 |
| 5,472,561 | * 12/1995 | Williams et al. | 156/627.1 |
| 5,576,629 | * 11/1996 | Turner et al. | 324/709 |
| 5,711,843 | * 1/1998 | Jahns | 156/345 |
| 5,830,310 | * 11/1998 | Doi | 156/345 |

\* cited by examiner

*Primary Examiner*—Gregory Mills
*Assistant Examiner*—Luz Alejandro
(74) *Attorney, Agent, or Firm*—Armstrong, Westerman, Hattori, McLeland & Naughton

(57) ABSTRACT

A plasma processing system including a signal sampling unit for measuring electric signals reflecting a plasma condition; a model expression memory for storing a model expression for relating values of the electric signals with plasma processing characteristics; a computing unit for substituting the values of the electric signals measured by the signal sampling unit into the model expression read from the model expression memory to computer predicted values of the plasma processing characteristics; and a diagnosing unit for diagnosing a condition of a plasma, based on the predicted values of the plasma processing characteristics. The plasma processing system of this structure permits a condition of a plasma to be estimated by substituting realtime measured electric signals into a model expression, whereby when a change of plasma processing characteristics occurs, the operator can immediately know it. Accordingly, occurrence of a large number of defective wafers can be precluded.

8 Claims, 8 Drawing Sheets

PLASMA PROCESSING SYSTEM

BACKGROUND OF THE INVENTION

1. Field of the Invention

The present invention relates to a plasma processing technique for use in fabricating semiconductor devices and, more particularly to a plasma processing system for processing wafers, etc., by the use of plasma, a process monitoring method, and method for fabricating a semiconductor device.

2. Description of the Related Art

Plasma processing systems use a reactive gas plasma excited by radio frequency electric power to etch a thin film on a surface of a substrate or deposit a thin film on a surface of a wafer by generated ions and radicals, and are widely used in processes for fabricating semiconductor devices.

A conventional plasma processing system will be explained with reference to a parallel plate reactive ion etching system shown in FIG. 8.

An upper electrode 62 and a lower electrode 64 are positioned opposite to each other in a vacuum chamber 60 for plasma processing. A wafer 66 to be etched is mounted on the lower electrode 64. A radio frequency electric power supply 70 for generating a plasma 68 between the upper electrode 62 and the lower electrode 64 is applied between the upper and the lower electrodes 62, 64 through impedance matching unit 72. The vacuum chamber 60 includes a flow rate controller 74 for introducing a required rate of an etching gas, and a gas pressure controller 76. The radio frequency electric power supply 70, the flow rate controller 74 and the gas pressure controller 76 are connected to a computer for system control 78.

Then, the operation of the conventional plasma processing system will be explained.

First, a wafer 66 to be processed is mounted on the lower electrode 64 in the vacuum chamber 60, and then an internal pressure of the vacuum chamber 60 is reduced to a required pressure.

Next, an etching gas is introduced into the vacuum chamber 60 through the flow rate controller 74 while an internal pressure of the vacuum chamber 60 is maintained constant by the gas pressure controller 76.

Then, in this state a radio frequency is applied between the upper electrode 62 and the lower electrode 64 to generate a plasma 68 between the electrodes. The operating frequency supplied by the radio frequency electric power supply 70 is, e.g., 13.56 MHz.

Thus, the film on the wafer 66 mounted on the lower electrode 64 is etched by ions and radicals in the plasma into a required pattern.

For the etching, usually etching conditions (system control parameters), such as a radio frequency electric power, a gas pressure, and gas flow rate, are set in the computer for system control 78, so that associated controller separately retain set values.

However, a plasma condition, which affects properties of an etching process, such as etching rate, etc., is determined by the so-called condition setting, in which set values, as of radio frequency electric power, gas pressure, gas flow rate, etc., are variously changed to investigate the relationship between the set conditions and etching rate, uniformity, selectivity and processed profile, etc., and the set conditions are adjusted so that characteristics obtained by the plasma processing, e.g., etching rate, etching uniformity, selectivity, processed profile etc. become as required, whereby mass production conditions are determined.

That is, a plasma condition is determined by correlation among a radio frequency electric power, a gas pressure, a gas flow rate, etc., and by separately controlling respective plasma parameters a plasma condition cannot be directly controlled. Accordingly, the conventional plasma processing system in which a radio frequency electric power, a gas pressure, a gas flow rate, etc., are separately controlled by the associated controller controlled by the computer for system control 78 cannot suitably control the plasma condition.

In the usual plasma processing system, for ends of TAT (turnaround time) improvement, etc., characteristics provided by processing are periodically checked by a line operator for in-line administration, but wafers are not checked one-by-one as to whether or not the processing is normally conducted.

As a result, it is accordingly impossible to check changes of processing characteristics, such as etching characteristics, caused by transient changes of the electrode surfaces and wall of the vacuum chamber 60 caused by increased numbers of processed wafers, fluctuation and troubles of the controller for various controls, etc., cannot be quickly checked at their occurrences. A number of defective wafers are often produced.

Even when etching is conducted, and changes of etching characteristics are found on wafers, causes for the changes cannot be identified, and the system is often forced to be stopped for a long period of time.

This also happens in plasma processing systems for film deposition systems.

SUMMARY OF THE INVENTION

An object of the present invention is to provide a plasma processing system which can realtime monitor fluctuation and transient changes of plasma processing characteristics to thereby provide higher fabrication yields and productivity.

The above-described object is achieved by a plasma processing system comprising: a measuring unit for measuring an electric signal reflecting a plasma condition; a model expression memory for storing a model expression for relating a value of the electric signal with a plasma processing characteristic; a computing unit for substituting the value of the electric signal measured by the measuring unit into the model expression read from the model expression memory to compute a predicted value of the plasma processing characteristic; and a diagnosing unit for diagnosing a condition of a plasma based on the predicted value of the plasma processing characteristic. The plasma processing system of this structure permits a condition of a plasma to be estimated by substituting realtime measured electric signals into a model expression, whereby when a change of plasma processing characteristics occurs, the operator can immediately know it. Accordingly, an occurrence of a large number of defective wafers can be precluded. The model expression permits a balance of a plurality of parameters to be related with the plasma characteristics to monitor the condition of the plasma at once in place of monitoring parameters of respective electric signals, e.g., current, voltage, phase, etc., whereby a cause for an abnormality of the system can be easily investigated.

In the above-described plasma processing system it is preferable that the plasma processing system further comprises an endpoint detector for detecting an endpoint of the plasma processing, based on the electric signal; and in which the computing unit computes actually measured value of the plasma processing characteristic, based on an endpoint information detecting by the endpoint detector, and the diagnosing unit diagnoses the condition of the plasma, based on difference between the predicted value and the actually measured value. By further providing unit for giving actually measured values, based on comparison of the actually measured values with the predicted values, it can be easily judged whether or not the plasma processing has been conducted in accordance with the model expression.

In the above-described plasma processing system it is preferable that the diagnosing unit decides whether or not plasma processing is continued, based on a diagnose result of the condition of the plasma. Occurrence of a large number of defective wafers processed outside a prescribed plasma condition can be prevented.

In the above-described plasma processing system it is preferable that the plasma processing system further comprises a controller for controlling the condition of the plasma, based on the predicted value so that the plasma processing characteristic is substantially constant. Wafers can be processed with suitable plasma processing characteristics.

In the above-described plasma processing system it is preferable that the measuring unit measures as the electric signal, at least one of a voltage, a current, a phase, an impedance or a self-bias voltage between a matching unit, and an electrode for applying a radio frequency electric power for generating a plasma.

In the above-described plasma processing system it is preferable that the plasma processing characteristic is an etching rate, etching uniformity, a selectivity or a processed profile.

In the above-described plasma processing system it is preferable that the plasma processing characteristic is a film depositing speed or deposition uniformity.

The above-described object is achieved by a process monitoring method comprising the steps of: realtime measuring an electric signal reflecting a plasma condition in a step of processing a practical wafer; computing predicted value of plasma processing characteristic by substituting value of the measured electric signal into a model expression for relating the value of the electric signal with the plasma processing characteristic; and diagnosing a condition of a plasma, based on the predicted value of the plasma processing characteristic. The process monitoring method permits a condition of a plasma to be estimated by substituting realtime measured electric signals into a model expression, whereby when a change of plasma processing characteristics occurs, the operator can immediately know it. Accordingly, occurrence of a large number of defective wafers can be precluded. The model expression permits to relate a balance of a plurality of parameters with the plasma characteristics to monitor the condition of the plasma at once in place of monitoring parameters of respective electric signals, e.g., current, voltage, phase, etc., whereby a cause for an abnormality of the system can be easily investigated.

In the above-described process monitoring method it is preferable that an endpoint of the plasma processing is detected based on the electric signal; an actually measured value of the plasma processing characteristic is computed based on an endpoint information; and the condition of the plasma is diagnosed based on difference between the predicted value and the actually measured value. Based on comparison of the actually measured values with the predicted values, it can be easily judged whether or not the plasma processing has been conducted in accordance with the model expression.

In the above-described process monitoring method it is preferable that one of system control parameters that is a cause for a change of the condition of the plasma is identified by comparing the electric signal predicted by a model expression for relating the system control parameter for controlling the condition of the plasma with the electric signal with the realtime measured electric signal. The model expression can relates system control parameters with the electric signals, and one of the system control parameters that is a cause of a change of a condition of a plasma can be easily identified by analyzing the model expression.

In the above-described process monitoring method it is preferable that in a case that the plasma processing characteristic changes as a number of processed wafers increases, a plurality of the model expression for relating value of the electric signal with the plasma processing characteristic, and a plurality of the model expression for relating the system control parameter with the electric signal are prepared in relation with numbers of wafers to be processed after system cleaning; and one of the model expressions that corresponds to a number of processed wafers after the system cleaning is read out, and the condition of the plasma is diagnosed, based on the read model expression. Model expressions are stored as a data base, whereby one of the model expressions suitable for a number of wafers to be processed after system cleaning is selected to diagnose a condition of a plasma.

In the above-described process monitoring method it is preferable that the diagnose of the sate of the plasma is conducted every time that one wafer is processed. This method can realtime monitor a condition of a plasma, and without increasing TAT, a condition of a plasma can be diagnosed every time that one wafer is processed.

In the above-described process monitoring method it is preferable that an average value of a plurality of data sampled at a set period of time is used as the electric signal for diagnosing the condition of the plasma.

In the above-described process monitoring method it is preferable that the model expression is computed, based on data given by a pre-experiment on a sample wafer and stored in a model expression memory, and are read from the model expression memory when the condition of the plasma is diagnosed.

The above-described object is achieved by a method for fabricating a semiconductor device including plasma processing, comprising the steps of: realtime measuring an electric signal reflecting a condition of a plasma in a step of the plasma processing of a practical wafer: substituting a value of the measured electric signal into a model expression for relating the value of the electric signal with a plasma processing characteristic to compute predicted value of the plasma processing characteristic; and diagnosing the plasma condition, based on the predicted value of the plasma processing characteristic. The method for fabricating the semiconductor device permits a condition of a plasma to be estimated by substituting realtime measured electric signals into a model expression, whereby when a change of plasma processing characteristics occurs, the operator can immediately know it. Accordingly, occurrence of a large number of defective wafers can be precluded.

In the above-described method for fabricating a semiconductor device it is preferable that an endpoint of the plasma processing is detected based on the electric signals; an actually measured value of the plasma processing characteristic is computed based on a detected endpoint information, and difference between the predicted value and the actually measured value is given to diagnose the condition of the plasma.

In the above-described method for fabricating a semiconductor device it is preferable that one of system control parameters that is a cause for a change of the condition of the plasma is identified by comparing the electric signal predicted by a model expression for relating the system control parameter for controlling the condition of the plasma with the electric signal with the realtime measured electric signal.

In the above-described method for fabricating a semiconductor device it is preferable that the model expression is computed based on data given by a pre-examination on a sample wafer and stored in a model expression memory, and is read from the model expression memory when the condition of the plasma is diagnosed.

DETAILED DESCRIPTION OF THE INVENTION

The plasma processing system, the process monitoring method and the method for fabricating the semiconductor device according to a first embodiment of the present invention will be explained with reference to FIGS. 1 to 7.

Figure 1:
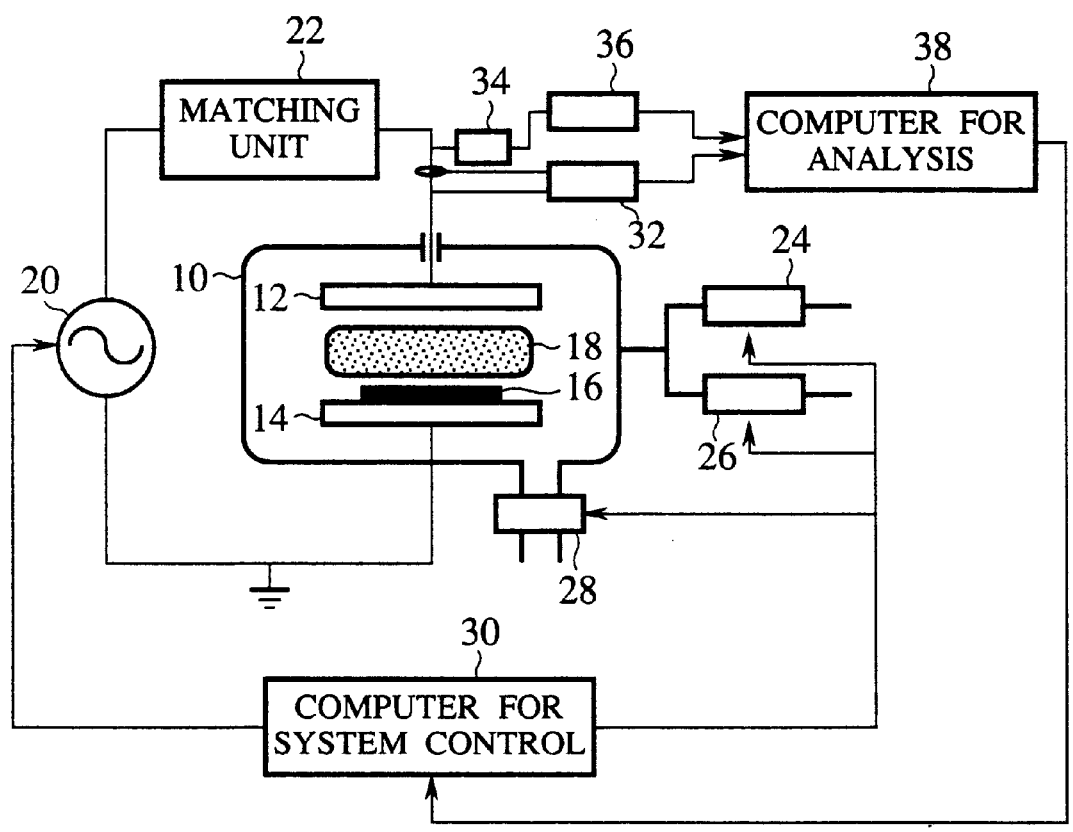
FIG. 1 is a diagrammatic view of the plasma processing system according to one embodiment of the present invention.
Figure 2:
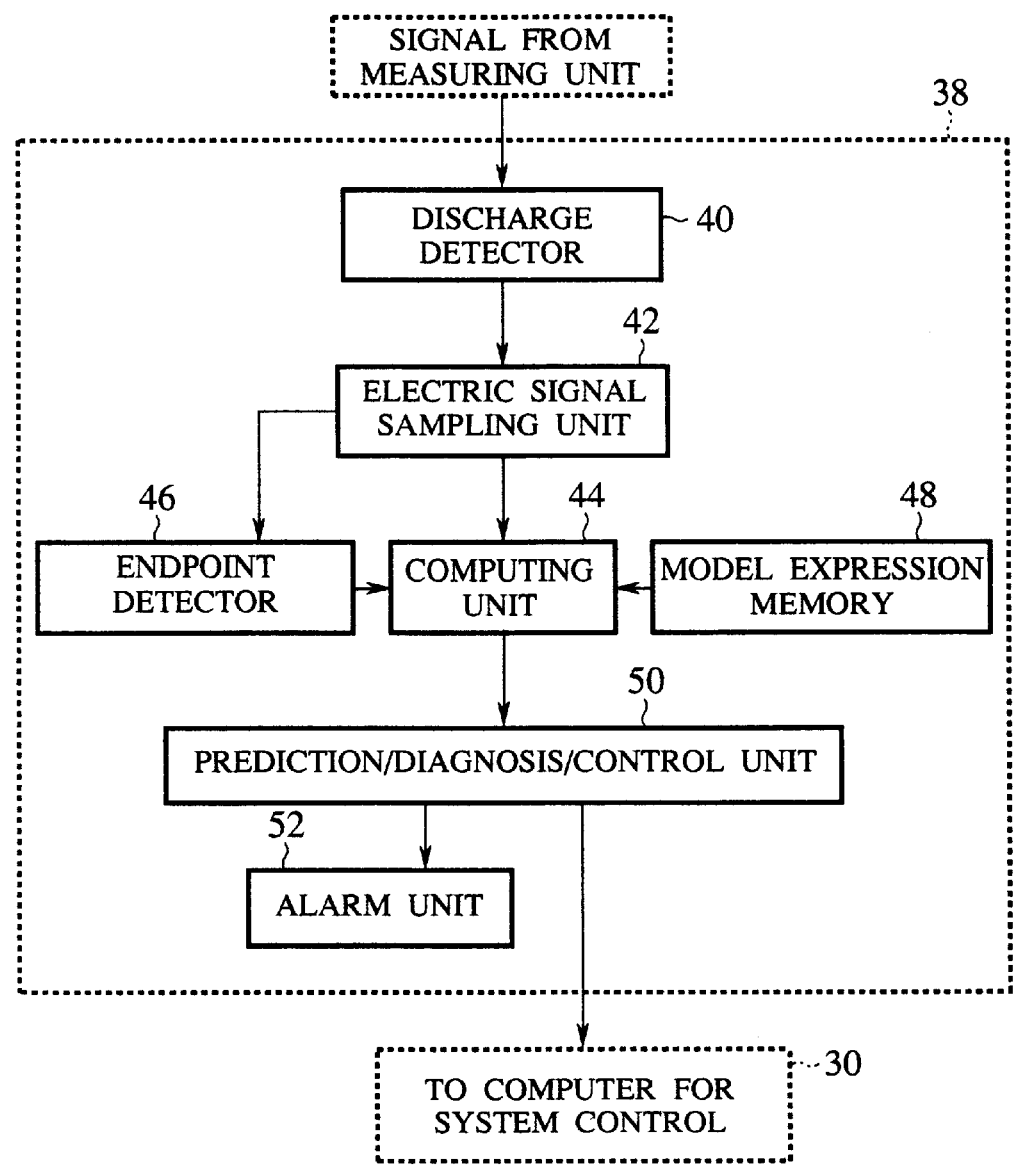
FIG. 2 is a view of one example of the system constitution of the computer for analysis of the plasma processing system according to the embodiment of the present invention.
Figure 3:
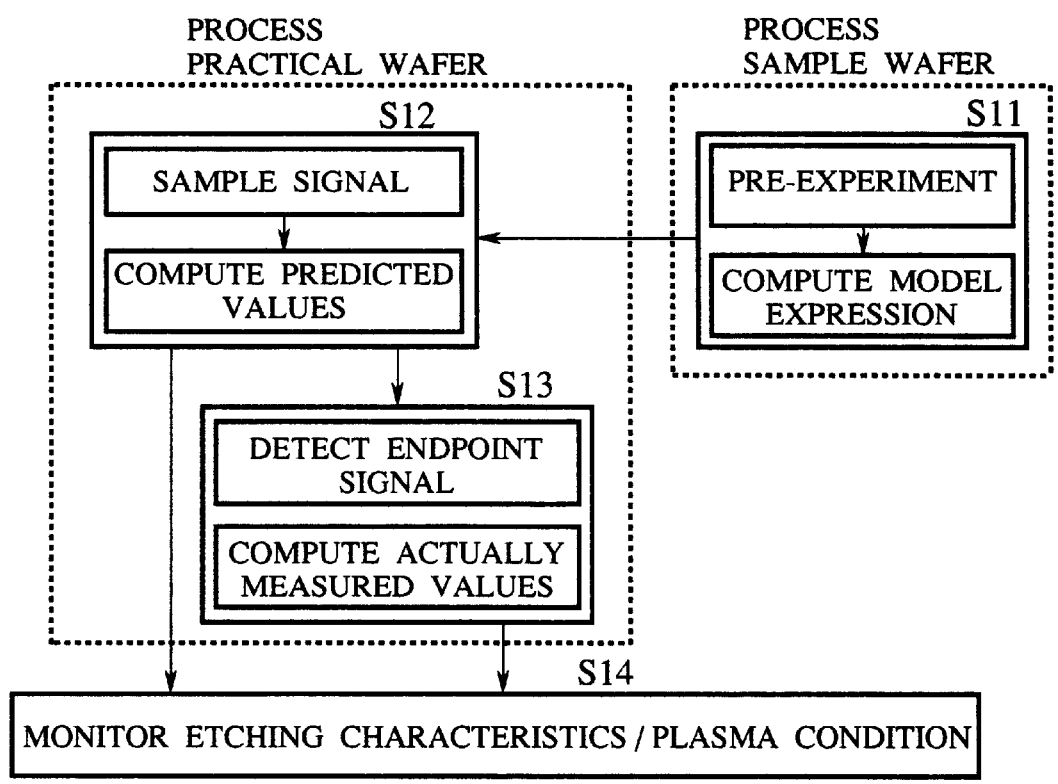
FIG. 3 is a flow chart of the processing procedure of the plasma processing system, the process monitoring method, and the method for fabricating a semiconductor device according to the embodiment of the present invention.
Figure 4:
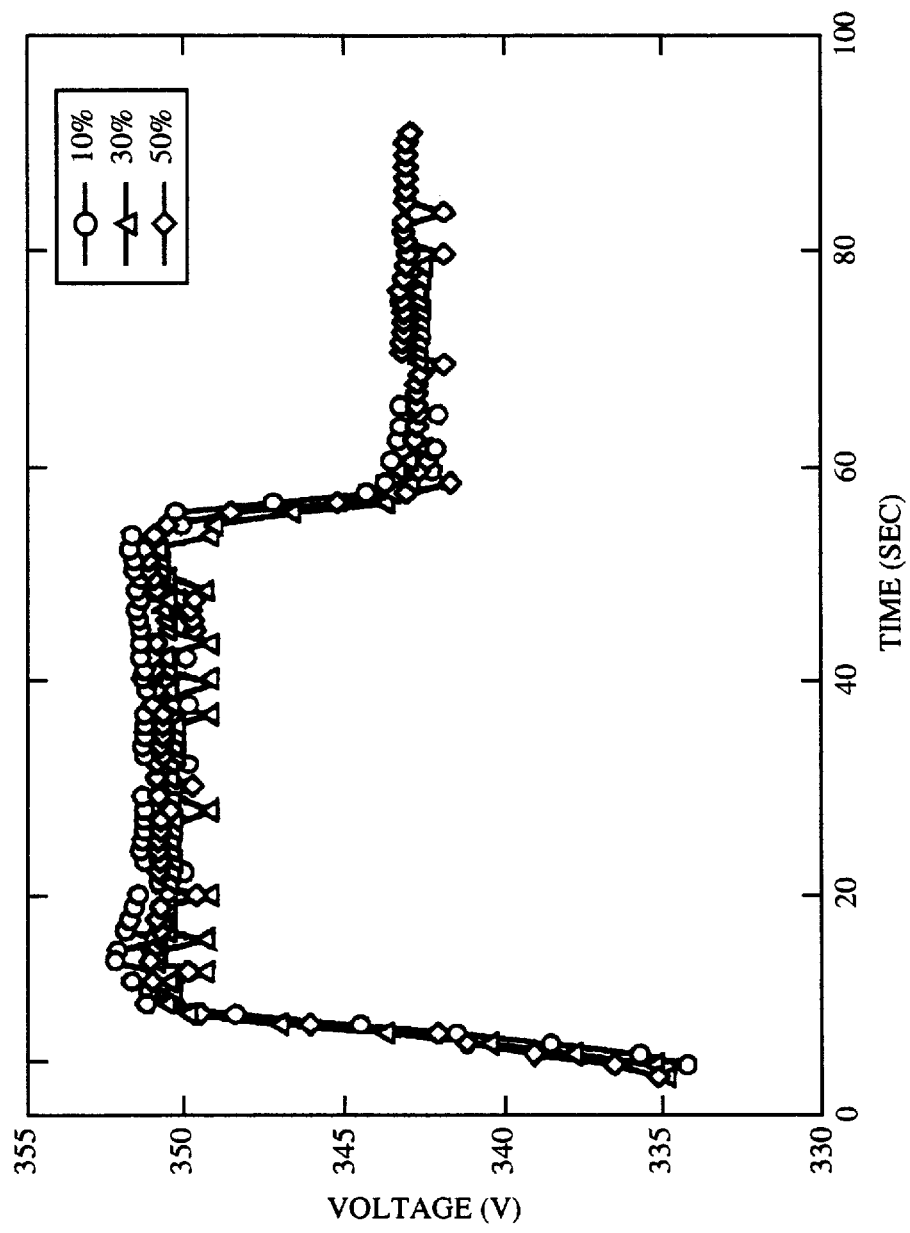
FIG. 4 is a graph of signal changes of the voltage signal in the plasma processing process.
Figure 5:
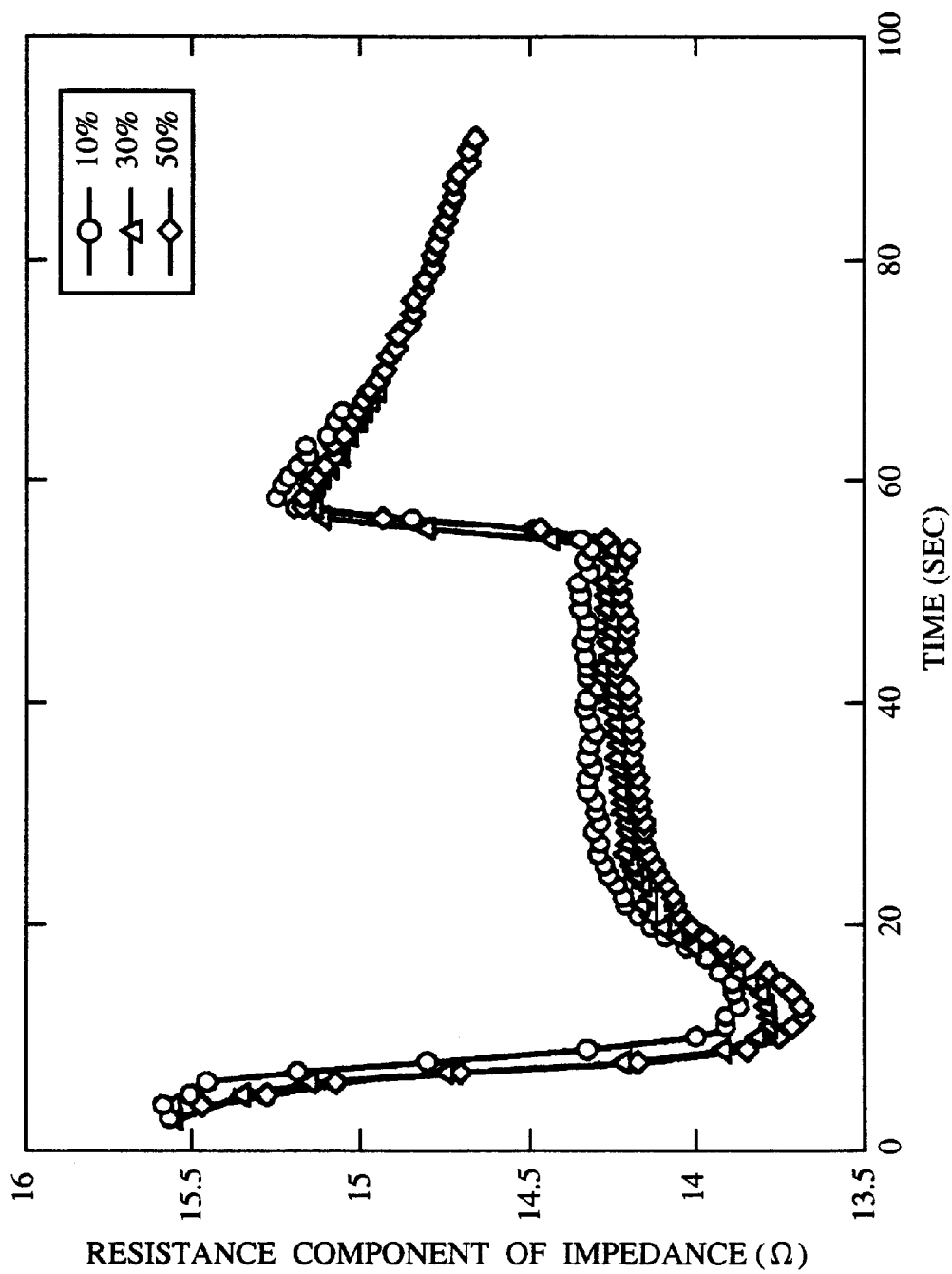
FIG. 5 is a graph of signal changes of the resistance component of the impedance in the plasma processing process.
Figure 6:
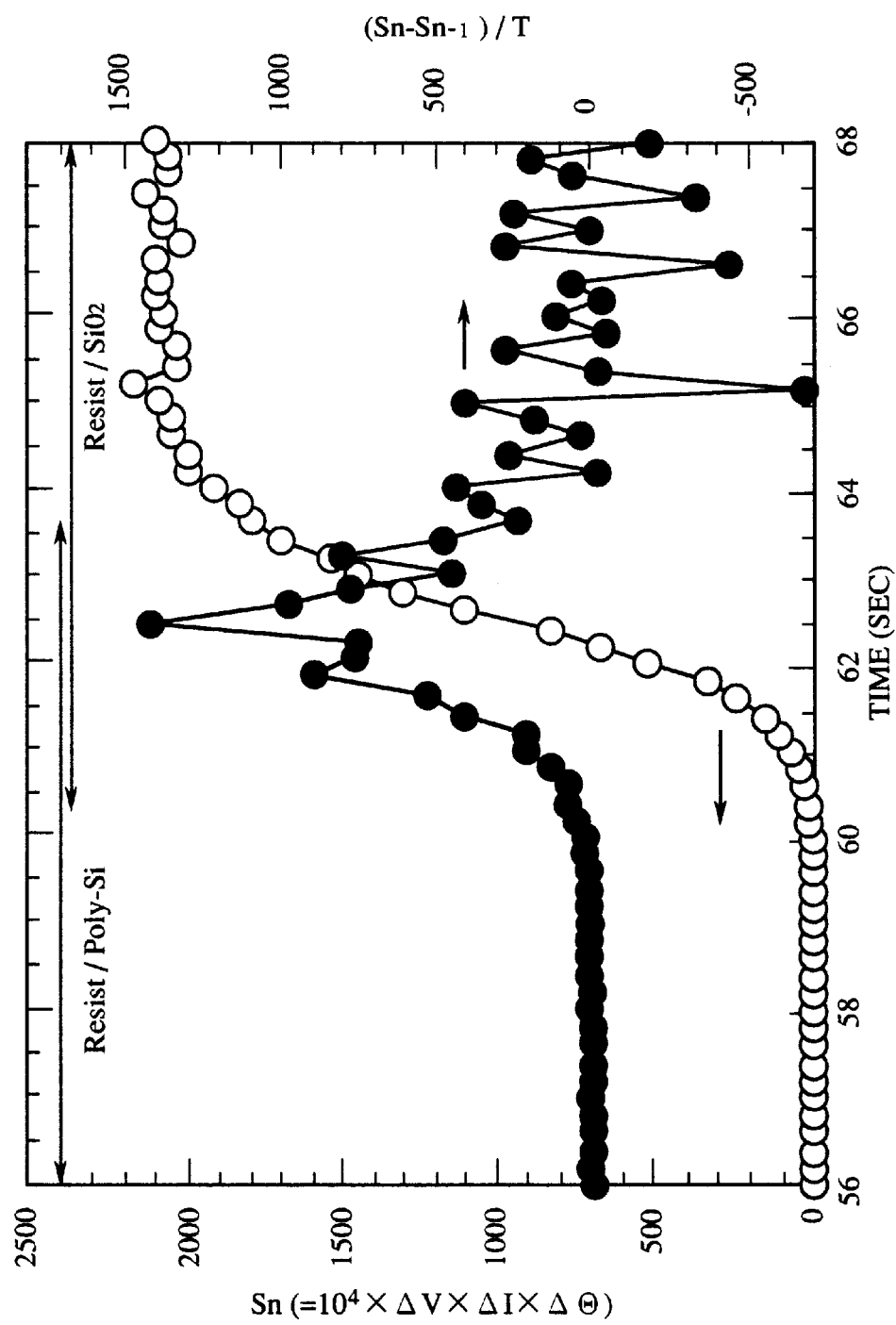
FIG. 6 is a graph of one example of the endpoint detection signal waveform in the plasma processing system according to the embodiment of the present invention (Part 1).
Figure 7:
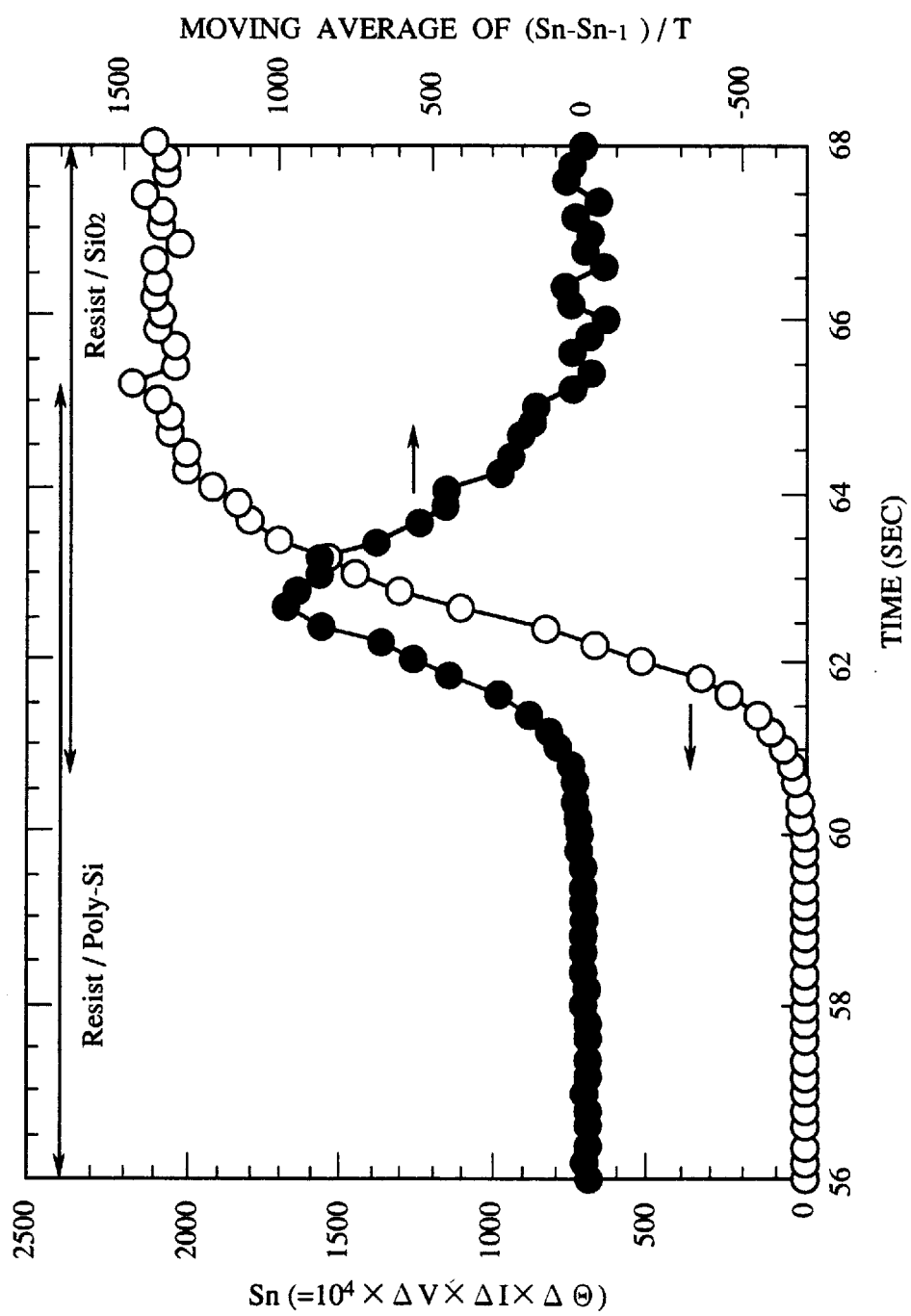
FIG. 7 is a graph of one example of the endpoint detection signal waveform in the plasma processing system according to the embodiment of the present invention (Part 2).
Figure 8:
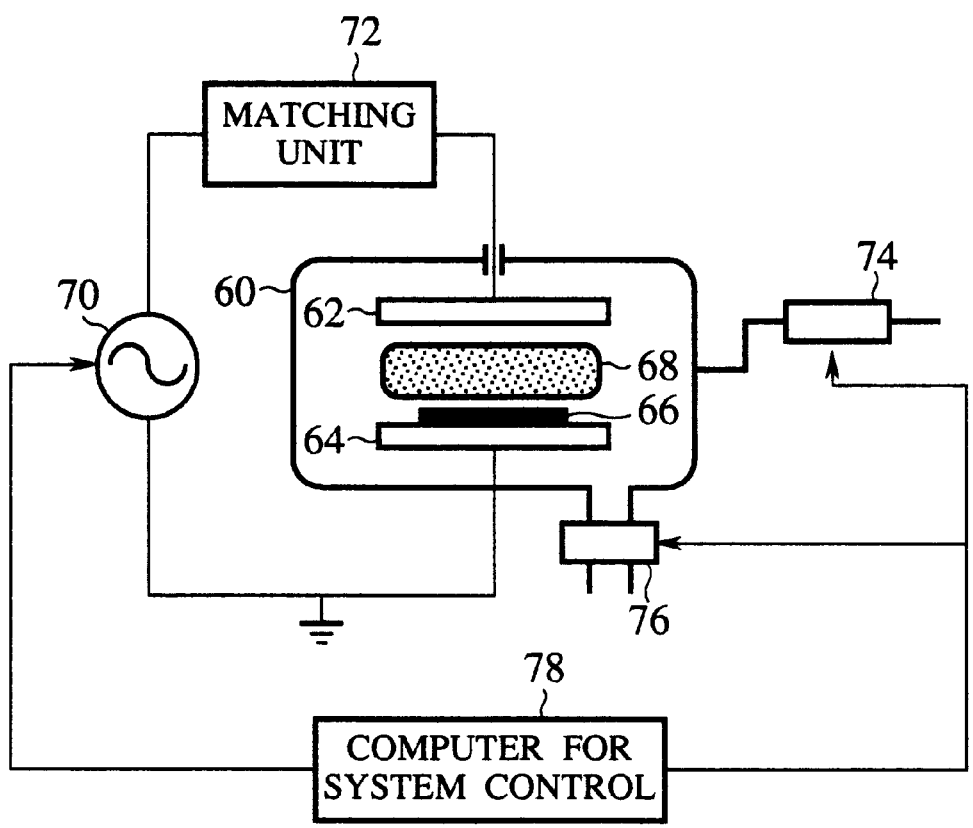
FIG. 8 is a diagrammatic view of the structure of the conventional plasma processing system.

FIG. 1 is a diagrammatic view of the plasma processing system according to the present embodiment, which generally explains the system. FIG. 2 is a view of an example of the structure of a computer for analysis. FIG. 3 is a flow chart of processing procedure of the plasma processing system, the process monitoring method and the method for fabricating the semiconductor device according to the present embodiment. FIGS. 4 and 5 are graphs of signal changes of an electric signal along advance of the plasma processing. FIGS. 6 and 7 are graphs of examples of waveforms of endpoint detection signal of the plasma processing system according to the present embodiment.

The plasma processing system according to the present embodiment will be explained by means of a plasma etching system, which is typical of the plasma processing system, but the present invention is applicable to other plasma processing system using plasma, e.g., plasma CVD systems, etc.

First, the plasma processing system according to the present embodiment will be diagrammatically explained with reference to FIGS. 1 and 2.

An upper electrode 12 and a lower electrode 14 are positioned, opposed to each other in a vacuum chamber 10 for plasma processing. A wafer 16 to be processed is mounted on the lower electrode 14. A radio frequency electric power supply 20 for generating a plasma 18 between the upper and the lower electrodes 12, 14 is applied between the upper and the lower electrodes 12, 14 through impedance matching unit 22. The vacuum chamber 10 is connected to flow rate controller 24, 26 for introducing an etching gas into the vacuum chamber 10 at a required flow rate, and gas pressure control 28. The radio frequency electric power supply 20, the flow rate controller 24, 26 and the gas pressure controller 28 are connected to a computer for system control 30 for controlling them.

A sensor is inserted between the impedance matching unit 22 and the upper electrode 12 so that a voltage, current, impedance, phase, etc., are measured by measuring unit 32. A self-bias voltage generated at the upper electrode 12 is measured by a voltmeter 36 through a filter circuit 34. Thus-measured values are automatically read every prescribed period of time. The computer for analysis 38 is connected to the computer for system control 30 so that an analysis result can be reflected on etching conditions.

As shown in FIG. 2, the computer for analysis 38 includes discharge detector 40, electric signal sampling unit 42, computing unit 44, endpoint detector 46, model expression memory 48, prediction/diagnosis/control unit 50 and alarm unit 52.

The discharge detector 40 selects at least one component of electric signals (voltage, current, phase, impedance, etc.) supplied by the measuring unit 32 and compares a value of the selected component with a preset value to thereby automatically detect generation of plasma discharge at the time of etching.

The electric signal sampling unit 46 realtime samples high-frequency electric signals of voltage, current, phase, impedance, self-bias voltage, etc., at a preset time interval.

The endpoint detector 46 computes based on information supplied by the discharge detector 40 and the electric signal sampling unit 42 to detect endpoint of the etching.

The model expression memory 48 stores a model expression for estimating plasma processing characteristics, based on system control parameters obtained by analyzing data of experiments of samples.

The computing unit 44 substitutes measured values of electric signals sampled by the electric signal sampling unit 42 into the model expression stored in the model expression memory 48 to compute etching characteristics, such as an etching rate, etching uniformity, etc., and computes actual values of the etching characteristics, such as an etching rate, etching uniformity, etc., based on endpoint information supplied by the endpoint detector 46.

The prediction/diagnosis/control unit 50 compares the predicted values and the actual values given by the computing unit 44 with each other to thereby predict and diagnose etching characteristics and a plasma condition and, based on a result of the comparison, make a feedback to following processing conditions.

The alarm unit 52 alarms the operator in accordance with a result given by the prediction/diagnosis/control unit 50.

Next, an operation of the plasma processing system according to the present embodiment will be diagrammatically explained with reference to FIG. 3.

The plasma processing system according to the present embodiment is based on beforehand relating by a mode expression values of electric signals, as of voltage, current, impedance, phase, self-bias voltage, etc., between the electrode for applying a radio frequency electric power and the impedance matching unit with plasma processing characteristics, such as etching rate, etching uniformity, etc., actually measured on sample wafers (Step S11), sampling radio frequency electric signals of the practical wafers in the plasma processing and substituting the model expression with the measured data to thereby compute predicted values of the plasma processing characteristics (Step S12), computing actual values of the plasma processing characteristics, based on an endpoint detection signal and sampling data of the electric signals (Step S13), and comparing the measured values and the predicted values of the plasma processing characteristics to thereby monitor plasma processing characteristics and plasma condition (Step S14).

The respective steps will be detailed.

[Pre-experiment Sample Wafers (Step 11)]

The pre-experiment is conducted for the purpose of measuring effect of typical system control parameters which influence plasma condition and giving a model expression for estimating plasma processing characteristics, based on the system control parameters.

First, a voltage, a current, an impedance, a phase and a self-bias voltage are measured under preset etching conditions, such as radio frequency electric power, gas pressure, gas flow rate, etc.

Then, the respective parameters of the etching processing conditions, such as radio frequency electric power, gas pressure, gas flow rate, etc., are deflected toward increase and decrease from the above-described measuring points to thereby measure electric signals of voltage, current impedance, etc. (three levels). In this case, the use of experimental design permit significant savings in both time and expense for the experiments (e.g., G. E. P. Box, W. G. Hunter, J. S. Hunter, "Statistic for Experimenters", John Wiley and Sons, New York (1978) or G. E. P. Box, N. R. Draper, "Empirical Model-Building and Response Surfaces", John Wiley and Sons, New York (1987)).

Then, correlation between etching characteristics, such as etching rate, etching uniformity, etc., obtained on the etching processed sample wafers, and the respective electric signals of voltage, current, impedance, phase, self-bias voltage, etc. measured in the etching processing are analyzed by, e.g., multiple regression analysis and expressed in a formula including linear terms and two factor interaction terms, or liner terms, two factor interaction terms and quadratic terms. In this case it is preferable that the expression has an above 0.8 coefficient of determination adjusted for the degree of freedom $R^2$-adj. and, in addition thereto, a number of parameters, such as voltage, etc., is fewer and a coefficient of determination adjusted for the degree of freedom $R^2$-adj. is larger.

Then, the thus-given model expression is stored in the model expression memory 48 of the computer for analysis 38 so that the model expression can be referred to in later data analyses.

For the computation of the model expression the computer for analysis 38 may be used, or a different device may be used. The sample experiment is not essentially conducted for each processing of the practical wafers.

The pre-experiment using sample wafers will be explained by an example of etching a polycrystalline silicon film formed on a silicon substrate through a silicon oxide film by plasma etching using HBr+He gases.

As a system control parameters, three parameters, radio frequency electric power, gas pressure, HBr ratio (=HBr/(HBr+He)×100), were selected. Experimental ranges were respectively 130–150 W, 250–300 mTorr and 55–65%. A flow rate of HBr+He was 320 sccm, an electrode interval was 8 mm, and a substrate temperature was 60° C.

The sample wafer comprises a 4 nm-thick silicon oxide film and a 200 nm-thick polycrystalline silicon film deposited on a silicon substrate, and has a patterned resist film formed on the polycrystalline silicon film. The silicon oxide film was formed by thermal oxidation, and the polycrystalline silicon film 52 was formed by a thermal CVD. The polycrystalline silicon film was deposited at 620° C.

Etching experiment were performed by using the above-described experimental design. Experimental run was repeated 15 times by the Box-Behnken design. The worksheet used in the experiment is shown in TABLE 1.

TABLE 1

| EXPERIMENT No. | RF POWER [W] | GAS PRESSURE [mTorr] | HBr RATIO [%] |
|---|---|---|---|
| 1 | 150 | 300 | 60 |
| 2 | 150 | 250 | 60 |
| 3 | 140 | 250 | 65 |
| 4 | 140 | 250 | 55 |
| 5 | 130 | 250 | 60 |
| 6 | 140 | 300 | 65 |
| 7 | 150 | 275 | 65 |
| 8 | 140 | 275 | 60 |
| 9 | 130 | 275 | 65 |
| 10 | 140 | 275 | 60 |
| 11 | 130 | 300 | 60 |
| 12 | 140 | 275 | 60 |
| 13 | 130 | 275 | 55 |
| 14 | 140 | 300 | 55 |
| 15 | 150 | 275 | 55 |

Under the above-described etching conditions, the polycrystalline silicon film was etched for 30 seconds.

An etching rate of the polycrystalline silicon film was given by measuring at 9 points in the wafer surface film thickness differences between film thicknesses before and after the etching and dividing an average value of the film thickness differences by an etching time. Uniformity of the polycrystalline silicon film was defined by (a largest one of film thickness differences at the 9 points—a smallest one of them)/(2×an average film thickness difference of those at the 9 points). A selectivity of the polycrystalline silicon film with respect to the silicon oxide film was given by etching the sample wafers until the silicon substrates are exposed. An etching time in which the polycrystalline silicon film is being etched, and an etching time in which the silicon oxide film is being etched were obtained by detection of etch produces by emission spectroscopy in the plasma and obtained an etching rate ratio between the times.

Respective values of electric signals, as of voltage, current, impedance, phase, self-bias voltage, etc., in the processing of the sample wafers were given based on average values of their values given in 20 seconds except initial 10 seconds in which the polycrystalline silicon is not etched.

Based on thus-given etching characteristics and electric signals, correlation among them were analyzed by the multiple regression analysis. The analysis used the following quadratic polynomial including linear terms, two-factor interaction terms and quadratic terms.

$$Y = b_0 + \sum_{i=1}^{3} b_i X_i + \sum_{i=1}^{2}\sum_{j=2}^{3} b_{ij} X_i X_j + \sum_{i=1}^{3} b_{ii} X_i^2$$

In the multiple regression analysis, when a coefficient of determination adjusted for the degree of freedom $R^2$-adj. is approximate to 1, the regression formula is very expressive of a phenomena. A plurality of regression formulas can be given, and it is preferable to use one of them that has a small number of parameters such as voltage, etc., and has a higher value of $R^2$-adj.

Relationships between etching characteristics and electric signals were given by the multiple regression analysis.

Etching rate [nm/min]=−39142.2−13.3×(Voltage)+ 15738.6×(Current)+508.6×(Phase)+3.3×(Voltage)× (Phase)−196.9×(Current)×(Phase)

Uniformity [%]=233.9−0.4×(Voltage)−103.8×(Current)− 1.0×(Voltage)×(Current)+0.005×(Voltage)$^2$+72.5× (Current)$^2$ Selectivity=192.4+0.75×(Voltage)−124.7×(Current)

In this case, $R^2$-adj. were respectively 0.99 (etching rate), 0.94 (uniformity) and 0.88 (selectivity).

In the experimental range according to the present embodiment, the etched polycrystalline silicon film did not change its sectional profile, and could not be expressed in a formula. However, when the polycrystalline silicon film changes its sectional profile in the experiment, the polycrystalline silicon film can be expressed in a formula, e.g., a sectional sidewall inclination angle, a ratio between a side etching amount and an etching depth, etc.

An example of formulating a sectional profile in a sectional sidewall inclination angle is shown below.

It was tried that an about 1 μm-depth groove is formed in the surface of the silicon substrate by the use of the etching system as described above. A 100 nm-thick thermal oxide film was used as an etching mask. As system control parameters, radio frequency electric power, gas pressure, HBr ratio, flow rate of HBr+He were used, and their experimental ranges were respectively 350–450 W, 450–500 mTorr, 50–80% and 250–390 sccm. An electrode interval was 8 mm, and a substrate temperature was 60° C.

Under these conditions, the etching was conducted, and a voltage, a current, an impedance, a phase, a self-bias voltage, etc. were measured during the etching. The etched wafer was divided, and the sectional profile was observed by a scanning electron microscope (SEM).

Correlation among a sectional sidewall inclination angle, and electric signals, such as voltage, current, impedance, phase, etc., were analyzed, and as a result, the sectional sidewall inclination angle was much correlated with impedance and could be expressed in following formula.

Sectional sidewall inclination angle [deg.]=355.88− 4.0812×(Impedance)+0.014144×(Impedance)$^2$ Thus, a sectional profile which is difficult to predict based on processing conditions can be predicted based on an impedance of the radio frequency signals.

The above-described results are correlation between electric signals and etching characteristics given by a pre-experiment, but by the multiple regression analysis correlation between etching system control parameters (radio frequency electric power, gas pressure, HBr ratio), and the electric signals can be given. These model expressions are very useful data for diagnosing the plasma condition. Correlation between the electric signals and the etching system control parameters of the above-described system given by the multiple regression analysis will be shown below.

Voltage [V]=126.715+1.637×(Radio frequency electric power)−0.077×(Gas pressure)−0.571×(HBr ratio)

Current [A]=−0.0942+0.0374×(Radio frequency electric power)+0.0054×(Gas pressure)−0.00525×(HBr ratio)− 0.00006×(Radio frequency electric power)×(Gas pressure)−0.0001×(Gas pressure)×(HBr ratio)

Phase [deg]=−86.325+0.0168×(Radio frequency electric power)−0.00855×(Gas pressure)−0.0643×(HBr ratio)

Impedance [Ω]=104.465−0.355×(Radio frequency electric power)−0.133×(Gas pressure)−0.366×(HBr ratio)− 0.0008×(Radio frequency electric power)×(Gas pressure)+0.0024×(Radio frequency electric power)× (HBr ratio)

Resistance component of Impedance [Ω]=0.142+ 0.000148×(Radio frequency electric power)− 0.000132×(Gas pressure)−0.000931×(HBr ratio)

Reactance component of Impedance [Ω]=115.4−0.426× (Radio frequency electric power)−0.047×(Gas pressure)+0.475×(HBr ratio)+0.0009×(Radio frequency electric power)×(Gas pressure)+0.00325× (Radio frequency electric power)×(HBr ratio)

In this case, coefficient of determined adjusted for the degree of freedom $R^2$-adj. are respectively 0.99 (voltage), 0.99 (current), 0.96 (phase), 0.99 (impedance), 0.99 (resistance component of impedance) and 0.99 (reactance component of impedance).

[Computation of Predicted Values of Plasma Processing Characteristics (Step S12)]

After the pre-experiment is conducted beforehand as described above, processing of the practical wafers is conducted.

In the processing of the practical wafers, values of respective electric signals, as of voltage, current, phase, impedance, self-bias voltage, etc. between the radio frequency electric power 20 and the impedance matching unit 22 are measured at a prescribed time interval by the measuring unit 32 and the voltmeter 36, etc. and are read in the computer for analysis 38 by the electric signal sampling unit 42.

Then, the thus-measured electric signal data are substituted into the model expression given in Step S11 to compute predicted values of plasma processing characteristics. Specifically, actually measured data measured by the electric signal sampling unit 42, and the model expression stored by the model expression memory 48 are read in the computing unit 44, and predicted values of plasma characteristics are computed by the computing unit 44.

In the sample experiment in Step S11, plasma characteristics, such as etching rate, uniformity, selectivity, etc. can be computed by substituting the above-described model expression with radio frequency electric signal data.

Accordingly actually measured data of the electric signals detected in Step S12 are substituted into the model expressions, whereby plasma processing characteristics in the processing of the practical wafers can be predicted.

The actually measured data are referred to by the prediction/diagnosis/control unit 50 of the computer for analysis 38 when later data analysis is conducted.

[Computation of Actual Values of Plasma Processing Characteristics (Step S13)]

In the processing of the practical wafers, an etching rate and etching uniformity are given based on an endpoint detection signal. The thus-given data are references for data analysis for estimating latter etching characteristics.

An etching rate can be given based on an etched film thickness, and a time until an endpoint is detected by the endpoint detector. Etching uniformity can be given based on a ratio between a time difference between a time when the endpoint detection is started and an endpoint detection signal change completely.

FIGS. 4 and 5 are graphs of one example of changes of signals of voltage and resistance component of impedance given by changing an over-etching amount in the plasma etching.

Electric signals, such as voltage, impedance, etc. change in accordance with surface states of a sample to be etched as apparently shown, and these signals are monitored to read signal changes, where endpoint of the etching can be detected.

In FIGS. 4 and 5, the endpoint detection start is around 55 seconds, and an abrupt signal change takes place around 58 seconds, which is the endpoint of the etching.

In detecting an endpoint by the use of the plasma processing system, specifically the endpoint can be given as follows.

In the above-described structure of resist film/polycrystalline silicon film/silicon oxide film/silicon substrate, three components, voltage V, current I and phase θ are selected, and as an endpoint detection signal, a computational signal $S_n$ $$S_n = 10^4 \times abs[\{V(t)-V(t_0)\} \times \{I(t)-I(t_0)\} \times \{\theta(t)-\theta(t_0)\}]$$

is effectively applicable. Here t=nT (T is a data sampling interval), $t_0$ is a delay time from an etching start to actuation of the endpoint detection function.

In the above-described system of resist film/polycrystalline silicon film/silicon oxide film/silicon substrate, voltage V, current I and phase θ were used as parameters for the endpoint detection. The computational signal $S_n$ changes depending on an etching gas or etching material, and it is preferable to suitably select, in accordance with a material system, processing signals which affect the endpoint detection.

A time by which a differential value $[=(S_n-S_{n-1})/T]$ of computational signals $S_n$ exceeds an initial endpoint level set value is defined as an endpoint detection starting time $t_i$, and a time when a differential value of computational signals is below a terminal endpoint level set value is defined as an endpoint detection time $t_e$. Then, an etching rate and uniformity are expressed Etching rate=(polycrystalline silicon film thickness)/($t_e$-10)

Uniformity=$K(t_{e-ti})/(t_i-10)$
(where K is an experimentally given value, and "10" unit an initial 10 seconds in which the polycrystalline silicon is not etched.)

Thus, an etching rate and etching uniformity can be given based on computational signals $S_n$.

FIG. 6 shows one example of endpoint detection signal waveform near the endpoint of an etching. In FIG. 6, "○" indicates a computational signals $S_n$, and "●" indicates a differential signal $(S_n-S_{n-1})/T$.

In detecting computational signals in the above-described system, as the silicon oxide film is exposed on the sample surface, the computational signal $S_n$ gradually increases (in an about 60–64 second region). That is, an endpoint can be detected based on a tendency of computational signal $S_n$ increases.

To give an endpoint detection start time $t_i$ and an endpoint detection time $t_e$ in a transit region of computational signals $S_n$, differential signals $(S_n-S_{n-1})/T$ of computational signals are used. Differential signals $(S_n-S_{n-1})/T$ of computational signals have a distribution having a peak at a time where the computational signals $S_n$ have a largest change. Accordingly, a time exceeding a set signal intensity as a reference is given as an endpoint detection start time $t_i$, and a time which is below the reference intensity is given as an endpoint detection time $t_e$. As shown in FIG. 6, however, differential waveforms following the start of an endpoint detection often oscillate, and in such case it is preferable to take a moving average of two or more differential values of computational signals $S_n$ to make the differential signal smooth.

FIG. 7 shows a differential signal waveform of the signal waveform shown in FIG. 6 given by taking a moving average of 5 differential values of computational signals $S_n$. In FIG. 7, for example, a time (about 61 seconds) when a moving average value of $(S_n-S_{n-1})/T$ exceed 100 is taken as an endpoint detection start time $t_i$, and a time (about 65 seconds) when the moving average value again becomes below 100 is taken as an endpoint detection time $t_e$, whereby an etching rate and etching uniformity can be given based on a differential waveform $(S_n-S_{n-1})/T$ of computational signals.

As described above, in the plasma processing of the practical wafers, electrical signal data are measured at a set interval, and actually measured data of etching rate and etching uniformity are given.

The endpoint detection signal is detected by the endpoint detector 46, and actually measured data are computed by the computing unit 44.

The actually measured data are referred to by the prediction/diagnosis/control unit 50 of the computer for analysis 38 in a later data analysis.

[Diagnosis of Etching Characteristics (Step S14)]

In this step, a plasma condition in which the practical wafers have been processed is diagnosed based on actually measured values and/or predicted values of etching characteristics given in Steps S12 and S13. A plasma condition is thus diagnosed, whereby the processing can be monitored realtime.

The plasma processing system according to the present embodiment can make various diagnoses, based on data given in the above-described steps. Various process monitoring methods as embodiments of the present invention will be explained.

EXAMPLE 1

When one sheet of wafer is processed, average values of respective components of realtime obtained electric signal data are given, and the thus-given average values are substituted into the model expression to give predicted values of the etching characteristics.

When the thus-given predicted values are within preset ranges, the etching is judged to have been normal, and the etching of a next wafer is continuously conducted.

On the other hand, when the thus-given predicted values are not in the preset ranges, the alarm unit indicates to the effect or makes an alarm for the operator to stop the etching.

Ranges of the etching characteristics used as the judgement references are determined by allowance ranges of empirically obtained data, processed profiles, etc.

EXAMPLE 2

When one sheet of wafer is processed, average values of respective components of realtime obtained electric signal data are given, and the thus-given average values are substituted into the model expression to give predicted values of the etching characteristics. Based on an endpoint detection signal, actually measured values of the etching rate and etching uniformity are given.

Differences between the thus-given predicted values of the etching characteristics, and the actually measured values are given, and when the differences are within preset ranges, the etching is judged to be normal, and the etching of a next water is continuously conducted.

On the other hand, when the differences exceed the preset ranges, the alarm unit 52 indicates to the effect or makes an alarm for the operator to stop the etching.

EXAMPLE 3

When one sheet of wafer is processed, average values of respective components of realtime obtained electric signal data are given, and the thus-given average values are substituted into the model expression to give predicted values of the etching characteristics. The average values of the respective components of the electric signal data are substituted into the model expression related with the system control parameters for comparison with reference values of the respective components of the electric signals used when the model expression was given in Step S11.

When the thus-given predicted values are within preset ranges, the etching is judged to have been normal, and the etching of a next wafer is continuously conducted.

On the other hand, when the predicted values are not within the present range, the alarm unit 52 indicates to the effect or makes an alarm for the operator stop the etching.

Such judgement is conducted, and data obtained by comparing the respective components of the electric signals with the reference values given when the model expression was given on the sample wafers are analyzed, whereby it is diagnosed which one of the system control parameters has a trouble.

EXAMPLE 4

When one sheet of wafer is processed, average values of respective components of realtime obtained electric signal data are given, and the thus-given average values are substituted into the model expression to give predicted values of the etching characteristics. Based on an endpoint detection signal, actually measured values of etching rate and etching uniformity are given. Furthermore, the average values of the respective components of the electric signal data are substituted into the model expression related with the system control parameters for comparison with reference values of the respective components of the electric signals used when the model expression was given in Step S11.

Differences between the thus-given predicted values of the etching characteristics, and the actually measured values are given, and when the differences are within preset ranges, the etching is judged to be normal, and the etching of a next water is continuously conducted.

On the other hand, when the differences exceed the preset ranges, the alarm unit 52 indicates to the effect or makes an alarm for the operator to stop the etching.

Such judgement is conducted, and data obtained by comparing the respective components of the electric signals with the reference values given when the model expression was given on the sample wafers are analyzed, whereby it is diagnosed which one of the system control parameters has a trouble.

EXAMPLE 5

In continuous processing a plurality of wafers in an etching system, plasma characteristics often gradually change due to influences of deposits on the inside wall of the vacuum chamber. Such plasma characteristics changes affect etching characteristics.

A typical phenomena of, e.g., Embodiment 2 or 4 is that absolute values of differences between predicted values and actually measured values of etching rate, etching uniformity, etc. tend to gradually increase as processed wafers increase. In this case, it is considered that deflections from reference values of the electric signals for obtaining the model expression on the sample wafers increase.

For a case that differences between the predicted values and the actually measured values have such relationship it is effective that trends of predicted and actually measured etching rate and uniformity, and the respective components of electric signals with respect to numbers of processed wafers until cleaning of the etching system are stored as a data base.

The data base is established, whereby it can been seen how the above-described parameters will change in accordance with numbers of wafers after cleaning of the etching system. This is effective for the diagnostics of the etching in the following cleaning cycles. For example, it is possible to select a model expression for estimating predicted values in accordance with a number of wafers to be processed after cleaning.

In a case that a difference between the predicted values and the actually measured values abruptly change, it can be judged that an abnormality has occurred in the etching system. In this case, deflection amounts of the electric signals from reference values of the electric signals computed by the use of a relational expression between the electric signals and system control parameters are also analyzed, whereby it can be estimated where the abnormality took place in the etching system.

EXAMPLE 6

In Examples 1 to 4, when a judgement result is not within a preset range, an alarm is made, but the system may be so arranged that a judgement result is feedback to etching conditions, whereby the etching can be constantly continued under suitable etching conditions. An example in which an etching rate is maintained constant will be explained.

In the above-described examples, an etching rate is expressed by voltage, current and phase of radio frequency signals, i.e., Etching rate [nm/min]=−39142.2−13.3×(voltage)+ 15738.6×(current)+508.6×(phase)+3.3×(voltage)× (phase)−196.9×(current)×(phase).

The coefficient of determination adjusted for the degree of freedom $R^2$-adj., which is a little decreased (about 0.95), but the expression can be simplified to be Etching rate [nm/min]=−409.8+207.4×(current).

Accordingly, the simplified model expression shows that to retain an etching rate constant a current of the radio frequency signal is retained constant.

According to the above-described examples, a current of the radio frequency signal is Current [A]=−0.0942+0.0374×(radio frequency electric power)+0.0054×(gas pressure)−0.00525×(HBr ratio)− 0.00006×(radio frequency electric power)×(gas pressure)−0.0001×(gas pressure)×(HBr ratio).

System control parameters are feedback to make a current constant, whereby an etching rate can be retained constant.

Similarly therewith, the sectional profile, etc. can be feedback controlled. That is, according to the above-described examples, a sectional sidewall inclination angle is Sectional sidewall inclination angle [deg.]=355.88− 4.0812×(impedance)+0.014144×(impedance)

System control parameters are feedback controlled to retain a value of impedance of the radio frequency signal constant, whereby a sectional profile can be controlled to be constant with good repeatability.

As described above, according to the plasma processing system, processing monitoring method and method for fabricating a semiconductor device according to the present embodiment, respective electric signals, as of current, voltage phase, etc. are not separately monitored, but instead a balance of a plurality of parameters is monitored at once in relationship with etching characteristics, etc., whereby causes for an abnormality in the system can be easily investigated.

When a practical wafer is processed, a plasma condition can be realtime seen. For example, every time one sheet of wafer is plasma processed, it can be automatically monitored whether or not the wafer is properly processed. In a case of a defective wafer, the processing is immediately stopped to investigate causes, or processing conditions are automatically or manually corrected to continue the processing.

Causes for an abnormality of the system can be easily investigated, whereby the plasma processing has improved reliability, and consequently higher yields and productivity can be obtained.

The present invention is not limited to the above-described embodiment and covers other various modifications.

For example, the plasma processing system according to the above-described embodiment includes a parallel plate-type electrode structure having the lower electrode grounded, but radio frequency electric power may be applied to the lower electrode alone or the upper electrode as well. In this case, electric signal parameters, such as voltage, current, etc. can be measured near either or both of the lower and the upper electrodes.

The system for generating a plasma is not limited to the parallel plate-type and may be selected out of various systems, such as TCP (Transformer Coupled Plasma) type, ICP (Inductively Coupled Plasma) type, helicon wave type, ECR (Electron Cyclotron Resonance) type, etc.

In the above-described embodiment, a plasma processing condition is monitored by a computer built in the plasma processing system but may be monitored by a computer disposed outside the system or a host computer connected to various fabrication apparatuses on fabrication lines for semiconductor devices. In this constitution, the process administration is enabled on fabrication lines for a semiconductor device, which contributes to automation of the fabrication steps and fabrication administration.

In the above-described embodiment the present invention is explained by unit of an etching system but is similarly applicable to film deposition systems, such as plasma CVD system, etc. In film deposition systems it is possible to estimate predicted values of deposition rate and film uniformity, based on electric signals.

What is claimed is:

1. A plasma processing system comprising:

a measuring unit for measuring an electric signal reflecting a plasma condition;

a model expression memory for storing a model expression for relating a value of the electric signal with a plasma processing characteristic;

an end point detector, based on said electric signal;

a computing unit for computing a predicted value of the plasma processing characteristic by means of substituting the value of the electric signal measured by the measuring unit into the model expression read from the model expression memory and for computing an actually measured value of the plasma processing characteristic based on an endpoint information detected by said endpoint detector; and a diagnosing unit for diagnosing a condition of a plasma based on a difference between the predicted value and the actually measured value of the plasma processing characteristic.

2. A plasma processing system according to claim 1, wherein the diagnosing unit decides whether or not plasma processing is continued based on a diagnosis result of the condition of the plasma.

3. A plasma processing system according to claim 1, further comprising.

a controller for controlling the condition of the plasma based on the predicted value so that the plasma processing characteristic is substantially constant.

4. A plasma processing system according to claim 1, wherein the measuring unit measures as the electric signal, at least one of a voltage, a current, a phase, an impedance or a self-bias voltage between an impedance matching unit, and an electrode for applying a radio frequency electric power for generating a plasma.

5. A plasma processing system according to claim 1, wherein the plasma processing characteristic is one of an etching rate, etching uniformity, a selectivity, or a processed profile.

6. A plasma processing system according to claim 1, wherein the plasma processing characteristic is a film deposition rate or deposition uniformity.

7. A plasma processing system according to claim 1, wherein the model expression is related to a number of substrates to be processed after cleaning of the system.

8. A plasma processing system comprising:

a first measuring unit for measuring an electric signal reflecting a plasma condition;

a model expression memory for storing a model expression for relating a value of the electric signal with a plasma processing characteristic;

a computing unit for computing a predicted value of the plasma processing characteristic by substituting the value of the electric signal measured by the measuring unit into the model expression read from the model expression memory and for computing an actually measured value of the plasma processing characteristic based on said electric signal; and a diagnosing unit for diagnosing a condition of a plasma based on a difference between the predicted value and the actually measured value of the plasma processing characteristic.

* * * * *